United States Patent [19]

Adachi et al.

[11] Patent Number: 4,672,328
[45] Date of Patent: Jun. 9, 1987

[54] WAVEGUIDE-MOUNTED AMPLIFIER

[75] Inventors: Masahiko Adachi, Niiza; Isao Ono, Aomori; Hiroaki Ikeda, Tokyo, all of Japan

[73] Assignees: Nippon Hoso Kyokai, Tokyo; Nippon Wave Guide Co., Ltd., Saitama, both of Japan

[21] Appl. No.: 807,356

[22] Filed: Dec. 10, 1985

[51] Int. Cl.[4] .......................... H03F 3/60; H03F 3/68
[52] U.S. Cl. ................................ 330/286; 330/277; 330/289; 330/295; 330/297
[58] Field of Search ................. 330/56, 277, 286, 287, 330/289, 295, 297

[56] References Cited

U.S. PATENT DOCUMENTS 4,124,823  11/1978  Sechi .............................. 330/286 X

FOREIGN PATENT DOCUMENTS 1277383  9/1968  Fed. Rep. of Germany ........ 330/56
56-74482  5/1981  Japan .

OTHER PUBLICATIONS

Bowers, "Impatt-Diode Multistage Transmission Amplifiers", *IEEE Transactions on Microwave Theory and Techiques*, vol. MTT-18, No. 11, Nov. 1970, pp. 943-951.
Pedinoff, "The Negative-Conductance Slot Amplifier," Ire *Transactions on Microwave Theory and Techniques*, Nov. 1961, pp. 557-566.
Tohyama et al., "23-GHz Band GaAs MESFET, Reflection-Type Amplifier", IEEE Transactions on Microwave Theory and Techniques, vol.-27, No. 5, May 1979, pp. 408-411.
MTT Symposium Sponsored by IEEE Held in 1978, C. F. Krumm proposed in his article on "A 30-GH$_z$ GaAs FET Amplifier" (pp. 383-385, Digest of Technical Papers).
The Institute of Electronics and Communication Engineers of Japan 3-242.

*Primary Examiner*—James B. Mullins
*Attorney, Agent, or Firm*—Stevens, Davis, Miller & Mosher

[57] ABSTRACT

A metal partition wall is placed inside a waveguide without ridge or the like and has an aperture in which a GaAs-FET is located, so that the input and output are coupled only through this GaAs-FET. The input and output terminals of the GaAs-FET are coupled through L-shaped coupling to the waveguide. An amplifier thus constructed has a high gain and is best adapted for power, while because the metal partition wall also serves as a heat sink.

20 Claims, 27 Drawing Figures

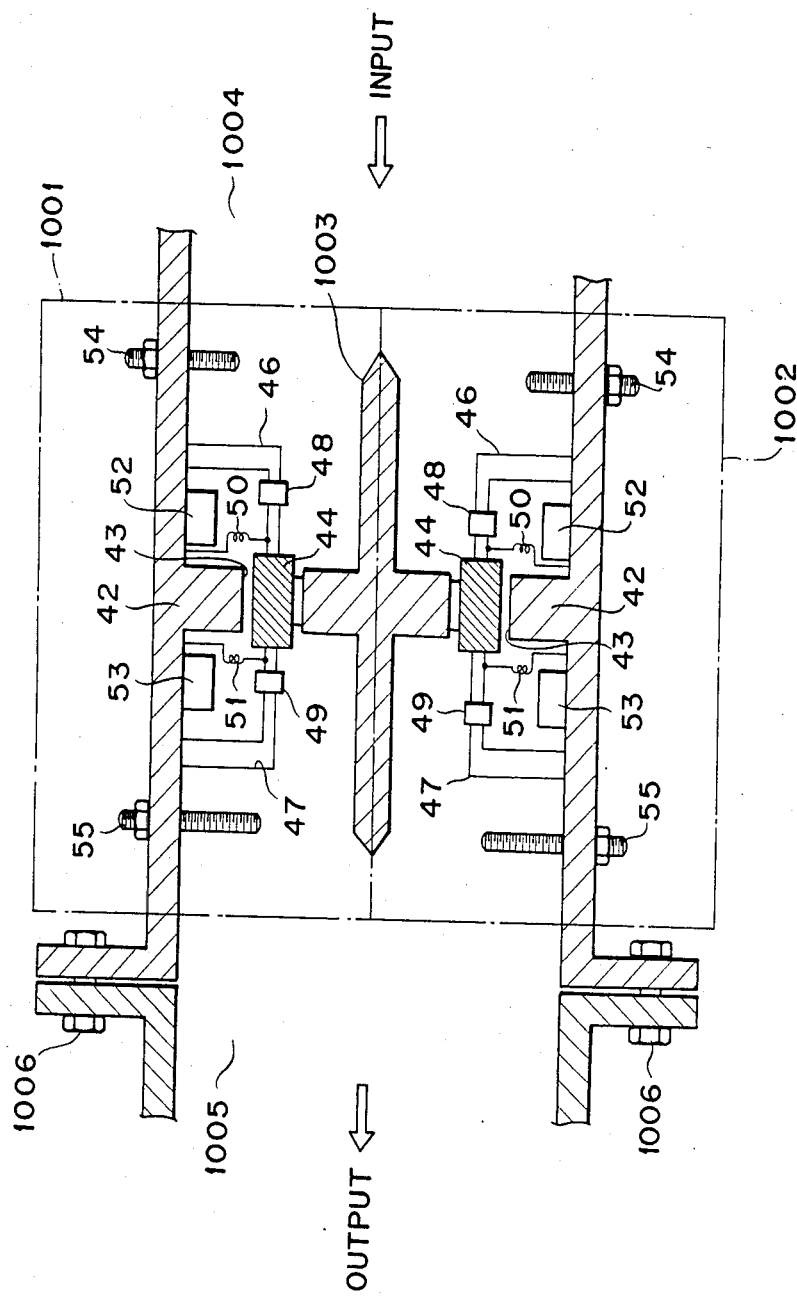

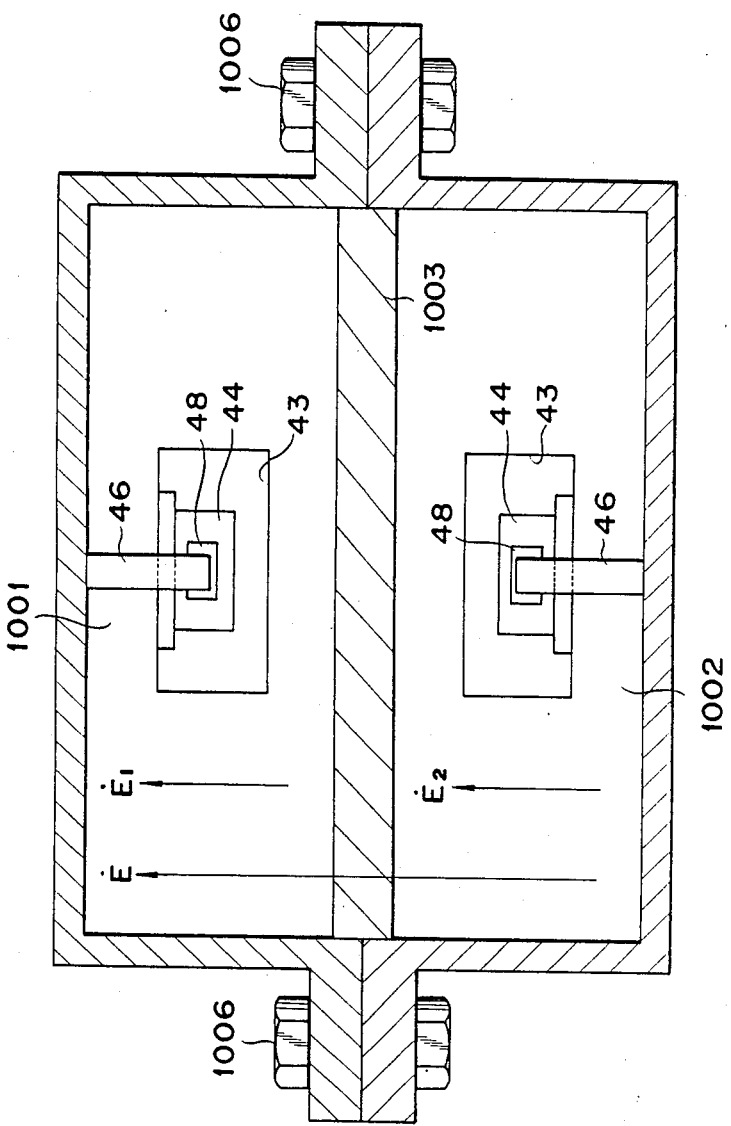

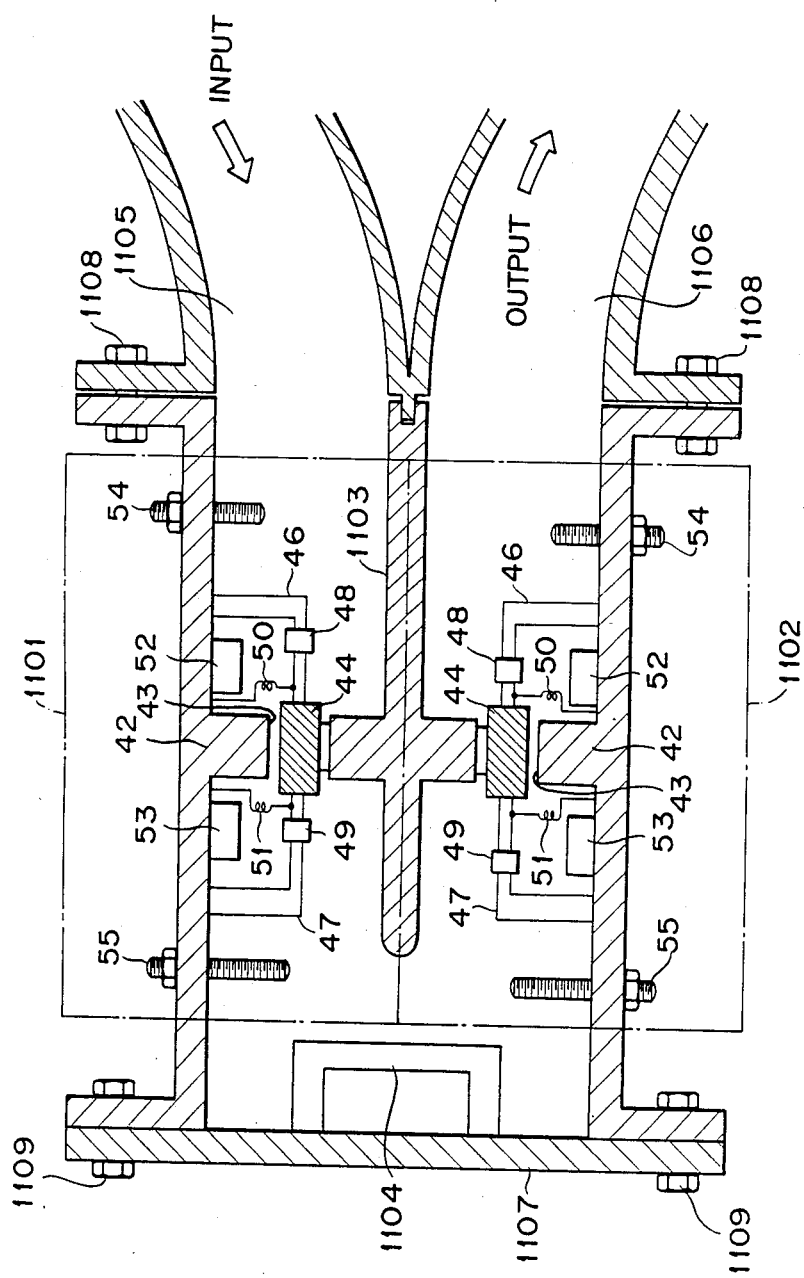

WAVEGUIDE-MOUNTED AMPLIFIER

BACKGROUND OF THE INVENTION

1 FIELD OF THE INVENTION

The present invention relates to a waveguidemounted amplifier having an active element arranged in a waveguide.

2. DESCRIPTION OF THE PRIOR ART

There has been devised and demonstrated an amplifier circuit for amplifying signals in an SHF band fabricated by thin film circuit techniques or thick film circuit techniques. Furthermore, amplifier circuits or oscillator circuits of the type in which semiconductor devices are arranged within a waveguide have been widely used. For instance, the amplifier circuits of the type in which a GaAs-FET is incorporated in a waveguide are well known in the prior art, but they can handle only low power and their uses are limited to the front-end amplifier.

In the case of an SHF-band amplifier fabricated by film circuit techniques, such passive elements as inductors, capacitors and lead wires are fabricated by using conductive metal layers formed on an insulating substrate. There is a considerable amount of radiation from these passive elements at high frequencies, i.e., in the SHF band and they accordingly cause problems of radiation losses. Furthermore, dielectric losses inherent to dielectric components at high-frequencies cannot be ignored and thus they cause problems of dielectric losses. Moreover, parasitic oscillation may frequently occur when the amplifier gain in each stage increases. In addition, the output response to the input signal is degraded by mutual coupling between the input and output signals due to radiation.

However, when a circuit is increased in size in order to eliminate such parasitic oscillation and mutual interference, power losses may increase. Therefore, both high gain and high stability have been extremely difficult to achieve while minimizing the losses.

FIGS. 1A and 1B show, one example of the prior art waveguide including a mounted diode. Here, a diode 13 is incorporated in a waveguide 11, and a voltage is applied to the diode 13 through a feeder 12 and the electromagnetic waves are radiated from part of the feeder 12 to travel through the waveguide 11. A short plunger 14 is provided to match the waveguide characteristic impedance with the desired value. However, this concept of incorporating diode 13 into waveguide 11 cannot directly be applied to realization of a waveguide-mounted amplifier wherein one or more three-terminal devices including GaAs-FETs are incorporated into a waveguide because diode 13 cannot be used as a three-terminal device for amplification.

Meanwhile, Japanese Utility Model Application No. 56-74482, filed May 25, 1981 (Laid-open No. 57-188401, laid open Nov. 30, 1982) discloses a microwave circuit in which, as shown in FIGS. 2A and 2B, waveguide 21 provides ridges 22 to match the waveguide impedance with the specified value at the point where device 23 is mounted. Input power is applied to GaAs-FET 23 which is fastened to ridges 22 and is amplified so that electromagnetic waves are radiated from waveguide 21.

Since, however, such a microwave circuit as shown in FIGS. 2A and 2B employs ridges 22, mentioned heretofore the electromagnetic-wave modes input to and output from GaAs-FET 23, used as an active device, through waveguide 21 and ridges 22 are converted in the interior of waveguide 21. Thus, ridges 22 must be long. This results in a microwave circuit of large size. In addition, losses are caused by mode conversion.

Furthermore, such a microwave circuit as shown in FIGS. 2A and 2B is proposed to be used for a front-end of each amplifier circuit. Therefore, even though NF is satisfactorily low with wide frequency band in each amplifier, the amplifier gain cannot be increased beyond a certain limit because the input and the output ports are not separated from each other.

For instance, H. Matsumura reported at the National Convention sponsored by The Institute of Electronics and Communication Engineers of Japan held in 1982 (The National Convention Record, No. 789) that two amplifier elements were serially connected in two stages so that the gain of 6 dB (at 14 GHz) was attained. However, the circuit is constructed in a limited use only to form a front-end amplifier. That is, if this type circuit is employed to construct a power amplifier circuit with a high gain, parasitic oscillation may occur due to by-passed input-to-output interaction. It results, therefore, in the necessity of providing separation means which is capable of separating the output from the input.

In the MTT symposium sponsored by the IEEE held in 1978, C. F. Krumm proposed in his article on "A 30-GHz GaAs FET AMPLIFIER" (pp.383–385, Digest of Technical Papers) an amplifier circuit of the type in which electromagnetic waves are received directly from an input waveguide and, are fed to an output waveguide after being amplified with a built-in active device. The amplifier circuit shown in FIG. 3 handles electromagnetic waves within waveguides 31 and 32 when operating for amplification, and thus the electromagnetic waves are amplified within the interior of the waveguides. But, input and output waveguides 31 and 32 are in the L-form and FET mount 33 is substantially arranged out of waveguides 31 and 32. Therefore, this type of circuit is attributed to another category, not the same as the microwave circuit disclosed in Japanese Utility Model Application No. 56-74482.

In the amplifier circuit shown in FIG. 3, two waveguides 31 and 32 are arranged in an opposed relationship and the respective ends which face to GaAs-FET mount 33 are bent upright so that waveguides 31 and 32 are L-shaped. A rim 33 mates with the upright open ends of waveguides 31 and 32, and is located on the open ends of waveguides 31 and 32 so as to bridge therebetween. That is; rim 33 has a pair of apertures aligned with the open ends of waveguides 31 and 32, and separated from each other by arm 34. Arm 34 has groove 35 in which a GaAs-FET 36 is arranged. A cover plate 37 covers rim 33. However, the positional relationship between waveguides 31 and 32, and GaAs-FET 36 is discontinuous and thus an increased gain-and-bandwidth product is difficult for this type of amplifier.

SUMMARY OF THE INVENTION

In view of the above, one of the objects of the present invention is to provide a waveguide-mounted amplifier best adapted for power amplification in which an active device is arranged in a waveguide without ridges while isolating the input port from the output port by isolation means.

Another object of the present invention is to provide a waveguide-mounted amplifier in which the input port and output port are coupled to each other only through an active element.

A further object of the present invention is to provide a high-gain waveguide-mounted amplifier in which the impedance matching between an active device and a waveguide can be suitably obtained.

In the first aspect of the present invention, a waveguide-mounted amplifier comprises:

a waveguide;

a partition wall located within the waveguide substantially perpendicular to a direction in which electromagnetic waves are propagated through the waveguide, the partition wall having an aperture; and an amplifying device located in the aperture of the partition wall.

Here, the waveguide may have a rectangular cross sectional configuration, and the partition wall can be disposed on an E plane thereof. The amplifying device can be a three-terminal active device having a common terminal connected to the partition wall within the aperture and input and output terminals extended from both sides of the partition wall through the aperture. The three-terminal active device may be a GaAs-FET.

The waveguide-mounted amplifier may further comprise:

an input coupling member and an output coupling member for the three-terminal active element located in sections of the waveguide on both sides of the partition wall, respectively, and connected to the input terminal and the output terminal, respectively; and a high frequency blocking member which is supplied the DC power respectively to the three-terminal active device.

In this case, the waveguide-mounted amplifier may further comprise adjustable impedance matching members located in the vicinity of the input and output coupling members, respectively, so that impedances of the input and output coupling members including the three-terminal active device are matched to the waveguide characteristic impedance.

Here, each of the matching members may comprise a metal member securely attached to an inner wall surface of the waveguide and stubs which are adjustably extended into the waveguide through the another inner wall which is in opposite to the inner wall surface of the waveguide to which the metal member is attached.

The input and output coupling members can be formed by extending members extending respectively into the input and output waveguide from the input and output terminals of the three-terminal active device so that the extending members perform inductive and/or electrostatic coupling to the input and output waveguides. Here, each end of the extending member may have a surface parallel to a plane formed by magnetic field in the waveguide to perform an electrostatic coupling to the waveguide inner wall.

The input and output coupling members can be substantially in the form of a T and the lower ends of the T shaped members may be coupled to the input and output terminals, respectively. The remaining ends of the T shaped members can be coupled respectively to the inner walls which are parallel to magnetic field in the waveguide to perform the coupling of the extending members to the waveguide. At least one of the couplings of the extending members to the input and output terminals and to the waveguides can be an electrostatic coupling.

The input and output coupling members can perform impedance matching. Here, each of the input and output coupling members can be a metal piece which has a tapered end portion located on the direction of the input and output waveguides and major surfaces of the metal piece can be coupled to the inner wall of surface perpendicular to the plane of an electrical field in the waveguide.

Metal conductor posts can be protruded from the surface perpendicular to the inner walls to an electrical field in the waveguide in a manner that each of the posts couples to the inner wall and middle portions of the posts are coupled to the input and output terminals, respectively.

The input and output coupling members can be substantially in the form of an L, and can have one ends coupled to the surface perpendicular inner wall to an electric field in the waveguide and the other ends coupled to the input and output terminals, respectively.

Here, the distance between the vertical portion of each of the L-shaped input and output coupling members and the partition wall can be substantially one quarter of a wavelength of the electromagnetic wave travelling through the waveguide. At least one end of each of the L-shaped input and output coupling members can perform electrostatic coupling. One end of at least one of the input and output coupling members can be coupled to the inner wall of the waveguide via a dielectric sheet.

In a second aspect of the present invention, a waveguide-mounted amplifier comprises:

a plurality of rectangular waveguide-mounted amplifiers stacked in a direction of an electrical field in each of the rectangular waveguides;

a plurality of partition walls, each located within the rectangular waveguide substantially perpendicular to a direction in which electromagnetic waves are propagated through the waveguide, and each partition wall having an aperture; and a plurality of amplifying devices, each disposed in the aperture of the partition wall.

A plurality of waveguide-mounted amplifiers, each having input and output waveguide sizes which can occupy respectively fractions of total sizes of pluralities of input and output rectangular waveguides in a direction of electric field, can be stacked in the direction of electric field one after another, and the pluralities of input and output rectangular waveguides can be respectively joined together in a manner that the electric field directions of the input and output rectangular waveguides and the plurality of waveguide-mounted amplifiers are coincident with each other, whereby an input electric field is dividedly applied to the plurality of waveguide-mounted amplifiers and output electric fields from the plurality of waveguide-mounted amplifiers are combined so that parallel amplification is performed by the plurality of waveguide-mounted amplifiers.

Two adjacent rectangular waveguides may be stacked in a manner that an input side of one waveguide corresponds to an output side of the other waveguide and that an output side of the one waveguide corresponds to an input side of the other waveguide. The input side of the one waveguide and the output side of the other waveguide can be coupled to an input waveguide and an output waveguide, respectively. The output side of the one waveguide and the input side of the other waveguide can be coupled to each other via a member for coupling and radiating electromagnetic wave.

In the third aspect of the present invention, a waveguide-mounted amplifier comprises:

a waveguide having a heat sink provided on at least one outer surface of the waveguide;

a partition wall located within the waveguide substantially perpendicular to a direction in which electromagnetic waves are propagated through the waveguide, the partition wall having an aperture; and an amplifying device located in the aperture of the partition wall.

The waveguide-mounted amplifier may further comprise a DC power source located on one outer surface of the waveguide and coupled to the amplifying device to feed an electrical power to the amplifying device other than the outer surface having the heat sink.

The waveguide-mounted amplifier of the first aspect may further comprise a DC power source located on one outer surface of the waveguide and coupled to the amplifying device to feed an electrical power to the amplifying device.

The above and other objects, effects, features and advantages of the present invention will become more apparent from the following description of preferred embodiments thereof taken in conjunction with the accompanying drawings.

BRIEF DESCRIPTION OF THE DRAWINGS

FIG. 11 is a sectional view showing yet another embodiment of a waveguide-mounted amplifier according to the present invention;

FIG. 12 is a cross sectional view of the combined amplifier shown in FIG. 11;

FIG. 14 is a sectional view showing yet another embodiment of a waveguide-mounted amplifier according to the present invention.

DETAILED DESCRIPTION OF PREFERRED EMBODIMENTS

Figure 1A:
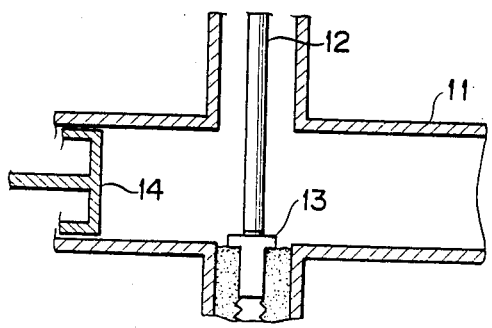
FIGS. 1A and 1B are sectional views illustrating prior art waveguides, each provided with a diode.
Figure 1B:
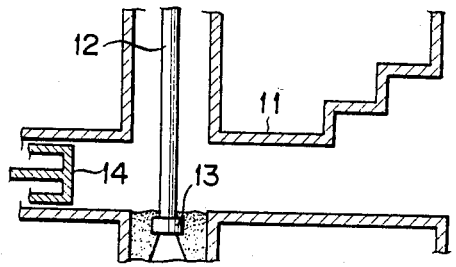
Figure 2A:
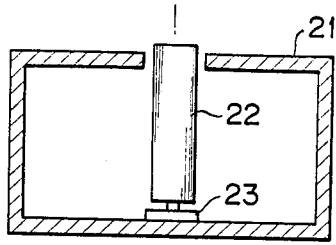
FIGS. 2A and 2B are a cross sectional view and a longitudinal sectional view of a prior art waveguide with ridges, respectively.
Figure 2B:
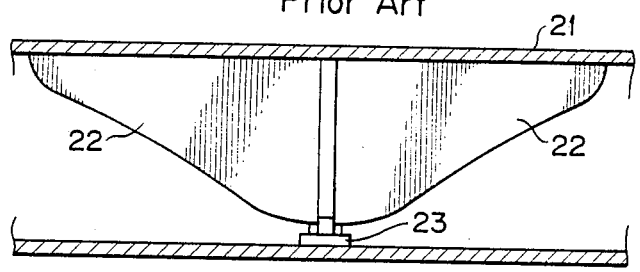
Figure 3:
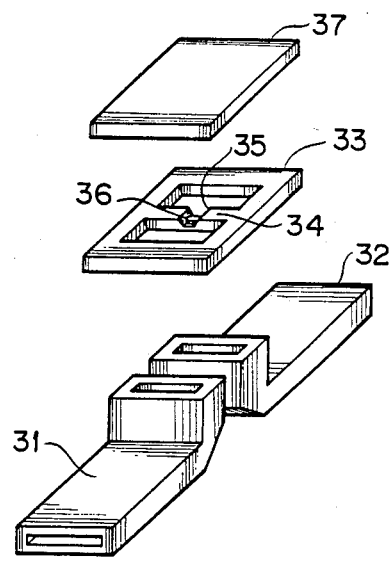
FIG. 3 is an exploded perspective view illustrating a prior art waveguide-mounted amplifier.
Figure 4:
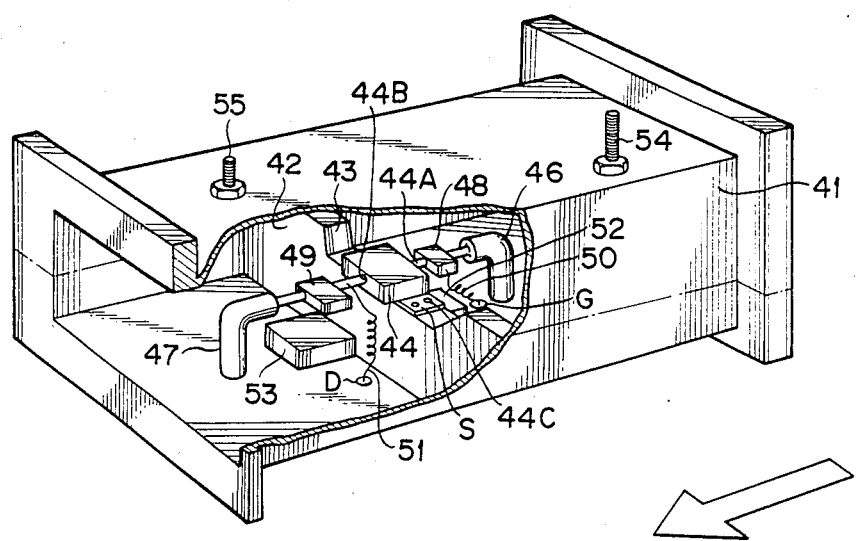
FIG. 4 is a perspective view, partly broken, of an embodiment of a waveguide-mounted amplifier in accordance with the present invention.

FIG. 4 shows an embodiment of a waveguide-mounted amplifier in accordance with the present invention. In FIG. 4, reference numeral 41 denotes a rectangular waveguide 41. A metal shielding or partition wall 42 with an aperture 43 is located inside waveguide 41 so that the waveguide 41 is divided into input and output sections. A three-terminal active device such as a GaAs-FET 44 is arranged in aperture 43 as an amplifier device. Input or gate terminal 44A and output or drain terminal 44B of GaAsFET 44 are extended from partition wall 42. Another output or source terminal 44C is connected to partition wall 42 within aperture 43 thereof.

Reference numeral 46 and 47 denote an input coupler and an output coupler made of an electrically conductive material. Couplers 46 and 47 are L-shaped and are used as feed means. Couplers 46 and 47 are connected through DC blocking capacitors 48 and 49 to input and output terminals 44A and 44B, respectively.

Input and output terminals 44A and 44B are connected through high-frequency choke coils 50 and 51, respectively, to exterior power terminals (not shown), so that the exterior power terminals and input and output terminals 44A and 44B are AC-blocked by choke coils 50 and 51, respectively, and consequently only DC voltage is applied to GaAs-FET 44.

Matching elements 52 and 53 such as metal pieces are arranged in the vicinity of couplers 46 and 47, respectively. Matching stubs 54 and 55 are extended inside from waveguide 41 substantially in an opposed relationship with couplers 46 and 47, respectively, and are adjustable in length within waveguide 41.

Waveguide 41, input and output couplers 46 and 47, shielding or partition wall 42, matching elements 52 and 53, and matching stubs 54 and 55 are made of metal, and waveguide 41 and one ends of couplers 46 and 47 are DC-connected. The other ends of couplers 46 and 47 are connected through DC blocking capacitors 48 and 49 (or insulating sheets) to three-terminal amplifier device 44. DC blocking capacitors 48 and 49 are those which exhibit a low impedance at high frequencies (such as chip capacitors or extremely thin insulating sheets).

Input and output terminals 44A and 44B of the three-terminal amplifier device 44 are connected at high frequencies through DC blocking capacitors 48 and 49, respectively, to couplers 46 and 47; and are also DC-connected through high frequency choke coils 50 and 51 to external power supplies (not shown) outside of waveguide 41.

When a GaAs-FET is used as a three-terminal amplifier device 44, gate and drain terminals G and D are connected to input and output couplers 46 and 47, respectively, and source terminal S is connected to shielding wall (metal partition wall) 42. DC bias voltages are applied to gate and drain terminals G and D of GaAs-FET 44 from the exterior. That is; a negative voltage is applied to gate terminal G, while a positive voltage is applied to drain terminal D and source terminal S is grounded for amplification.

In this case, at high frequencies, input and output couplers 46 and 47 normally function as antennas. For instance, the voltage induced in input coupler 46 by the electromagnetic waves on the input side of waveguide 41 is applied to amplifier device 44 so that input power thereof is amplified and, is derived, as an amplified output, from output coupler 47 after power amplification is accomplished.

Metal partition wall 42 is arranged perpendicular to the axis of waveguide 41, so that the interior of waveguide 41 is divided into the input and output sections on both sides of wall 42. Therefore, the undesired mutual interconnection between the input and output can be reduced to a minimum, so that stable amplification is ensured.

Shielding wall 42 also serves as a base on which amplifier device 44 is mounted. That is; the height of amplifier element 44, i.e., the location where aperture 43 is formed can be adjusted by properly selecting the location of partition wall 42 and the characteristic impedance to waveguide 41 is lowered at high frequencies. Amplifier device 44 can be short-circuited to or separated from waveguide 41 in DC potential, depending upon the manner in which amplifier element 44 is connected to the DC power supply.

In the case of connection of terminals 44A, 44B and 44C of amplifier element 44, it is possible to increase the length of their lead wires, but a long lead wire is not preferable, because the inductance of these lead wires has an unfavorable effect on the circuit configuration. It follows, therefore, that it is preferable to reduce the parasitic impedance to a minimum by adjusting the location of aperture 43 on shielding wall 42, in which the amplifier device 44 is arranged.

Shielding wall 42 also functions as a heat sink, so that the heat generated in amplifier device 44 can be immediately transmitted to waveguide 41. This results in a decrease of temperature rise within amplifier device 44 and stable amplification can be ensured.

Input and output couplers 46 and 47 are conductors which are substantially in the form of an L and are arranged in waveguide 41 perpendicular to the axis thereof. As described above, one ends of input and output couplers 46 and 47 are completely electrically connected to waveguide 41, while the other ends thereof are connected through capacitors 48 and 49, respectively, to amplifier element 44. In general, the impedances of couplers 46 and 47 are other than the optimum input and output impedances of amplifier element 44, so that impedance matching elements 52 and 53 as well as matching stubs 54 and 55 must be provided.

Figure 5A:
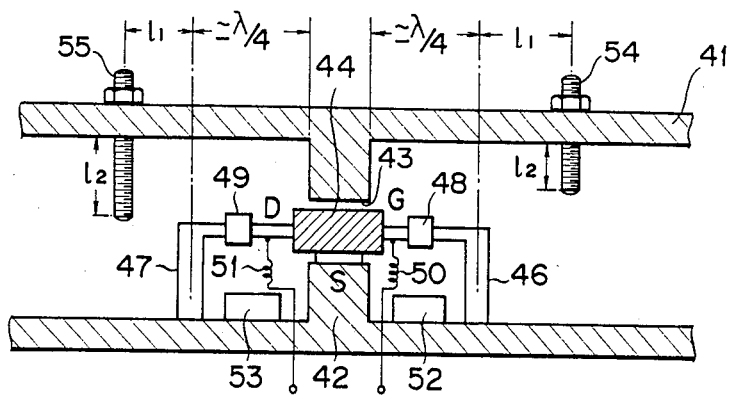
FIG. 5A is a longitudinal sectional view thereof.
Figure 5B:
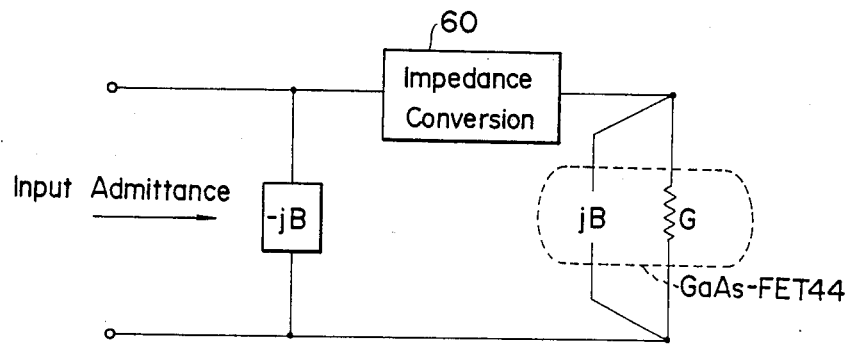
FIG. 5B shows an equivalent circuit of an input matching circuit.
Figure 5C:
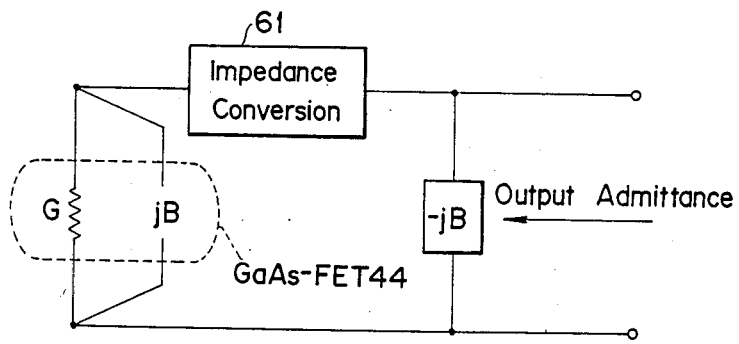
FIG. 5C shows an equivalent circuit of an output matching circuit.

Impedance matching in the waveguide-mounted amplifier in accordance with the present invention will be described with reference to FIGS. 5A, 5B and 5C. FIG. 5A is a longitudinal sectional view of the preferred embodiment of the waveguide-mounted amplifier in accordance with the present invention. FIG. 5B is an equivalent circuit of the input matching circuit while FIG. 5C is an equivalent circuit of the output matching circuit.

As is clear from FIG. 5A, according to the present invention, the impedance of waveguide 41 is matched with input and output impedances (that is; the gate and drain impedances) G and jB by matching stubs 54 and 55, respectively, so that the operation of amplifier device 44 is stabilized. Reference numerals 60 and 61 represent impedance conversion at the respective λ/4 portions.

The impedance matching between waveguide 41 and GaAs-FET 44 is attained by suitably selecting the respective positions $l_1$ of matching stubs 54 and 55, and the respective lengths $l_2$ of matching stubs 54 and 55 extended inwardly from waveguide 41. In general, $l_1$ and $l_2$ can be obtained from the following equations:

$$l_1 = \frac{\lambda}{2\pi} \cos^{-1} \sqrt{\frac{G}{1+G}}$$

and $$l_2 = \frac{\lambda}{2\pi} \tan^{-1} \sqrt{\frac{G}{1-G}}$$

, where
λ is the wavelength of an electromagnetic wave within waveguide 41, and
G is the load conductance.

Metal members as matching elements 52 and 53 are arranged in the vicinity of couplers 46 and 47, respectively, so that an electrical equivalent circuit in which a capacitor $-jB$ is inserted can be obtained. Thus, impedance matching between GaAs-FET 44 and waveguide 41 can be attained not only by matching elements 52 and 53, but also by matching stubs 54 and 55.

Satisfactory impedance matching can be attained by the arrangement as shown in FIG. 5A. For instance, the VSWR values measured when the lengths $l_2$ of coupling stubs 54 and 55 have been adjusted is shown in FIG. 5D.

Figure 5D:
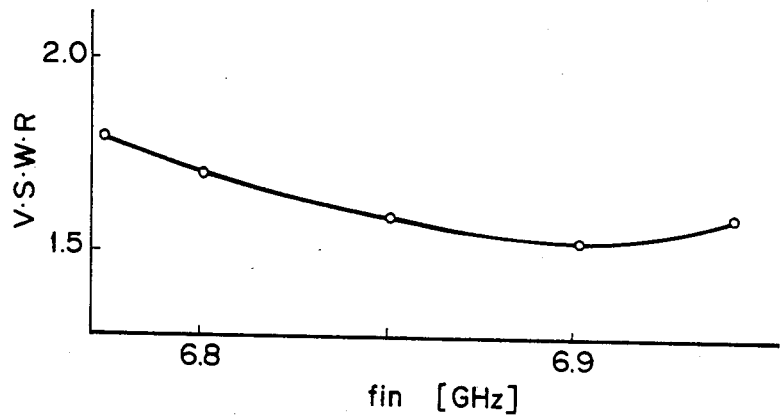
FIG. 5D illustrates a characteristic curve of a VSWR value with respect to input frequency fin based on the data obtained in the experiments of the waveguide-mounted amplifier in accordance with the present invention.

In FIG. 5D, the VSWR ranges from 1.5 to 1.8 at a frequency in a range from 6.8 to 6.9 GHz. In addition, when a pair of isolators are interposed between the input port and pre-amplifier, and between the pre-amplifier and output port, an extremely high degree of isolation can be ensured. In this case, the power loss due to the insertion of the isolators is of the order of 0.2–0.3 dB at 6.8–6.9 GHz.

Figure 6A:
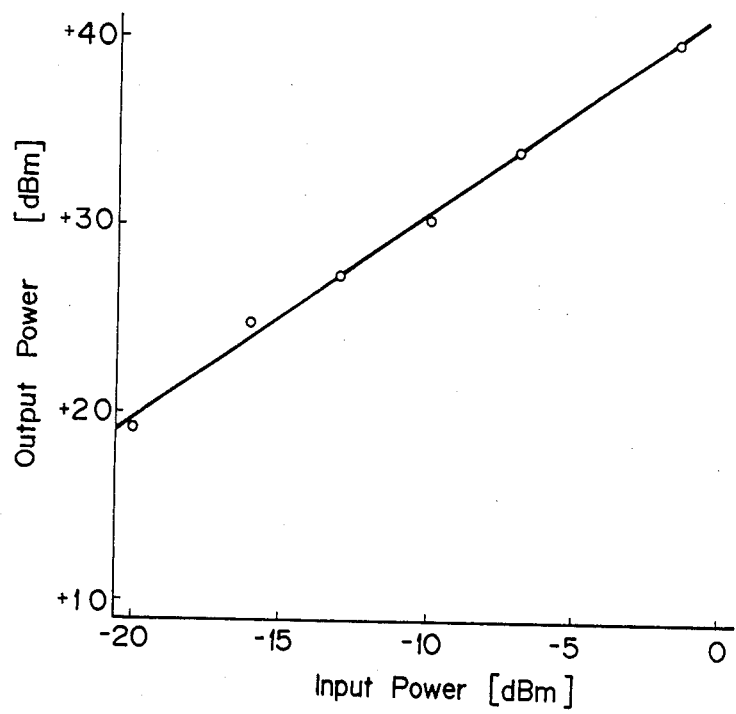
FIGS. 6A and 6B illustrate characteristic curves based on the data obtained in the experiments of the waveguide-mounted amplifier in accordance with the present invention.
Figure 6B:
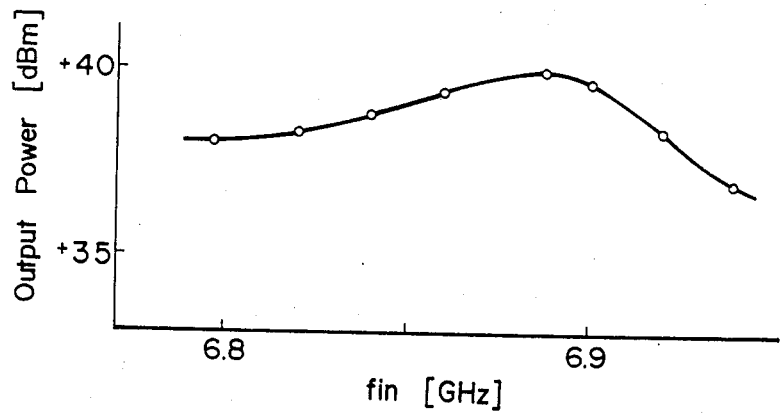

FIGS. 6A and 6B illustrate data obtained from the experiments of a 7 GHz-band FET power amplifier in which the amplifiers in accordance with the present invention were used in the intermediate and output stages. The amplifier consists of a three-stage intermediate amplifier of a conventional strip-line, low power type, and an output stage in accordance with the present invention. The experimental amplifier consists of GaAs-FETs arranged in four stages, and it has a gain of approximately 24 dB at 7 GHz. The low-power type amplifier for the intermediate stages consists of GaAs-FETs arranged in three stages, and it has a gain of 14 dB at 7 GHz. The output stage consists of a single-end type amplifier whose output power was approximately 10 watts at 7 GHz. The gain was about 3 dB at 7 GHz, and the drain efficiency was 60%. The output stage exceeded the power level obtained by the prior art GaAs-FET amplifier, and it was substantially equal to that of a TWT (traveling-wave tube). The power gain was closer to the available power gain of the GaAs-FET. The high gain attained by the output stage for power amplification was stably realized without any parasitic oscillations in accordance with the present invention.

FIG. 6A illustrates the input-output response when f=6.8875 GHz. The input power (dBm) is plotted along the abscissa, while the output power (dBm) is plotted along the ordinate. More detailed input and output data are shown in TABLE 1.

TABLE 1

| Input power (dBm) | Output power (dBm) |
|---|---|
| −1.5 | +40.0 |
| −7 | +34.1 |
| −10 | +30.9 |
| −13 | +27.4 |
| −16 | +24.9 |
| −20 | +19.3 |

FIG. 6B illustrates the frequency response of the amplifier described above. The frequency (GHz) is plotted along the abscissa, while the output power (dBm) is plotted along the ordinate. More detailed frequency characteristic data are shown in TABLE 2.

TABLE 2

| Input frequency (GHz) | Output power (dBm) |
|---|---|
| 6.747 | +38.0 |
| 6.500 | +38.3 |
| 6.840 | +38.8 |
| 6.860 | +39.4 |
| 6.883 | +40.0 |
| 6.900 | +39.4 |
| 6.920 | +38.4 |
| 6.940 | +37.0 |

Figure 7:
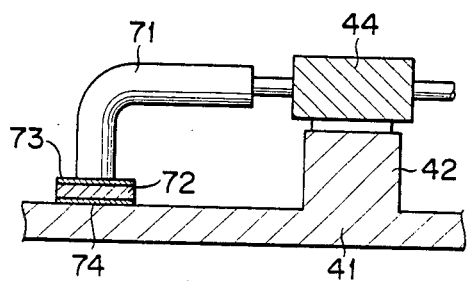
FIG. 7 is a sectional view showing a modification of the coupling means in the present invention.

The arrangement of couplers 46 and 47 and capacitors 48 and 49, which establish the electromagnetic coupling as shown in FIG. 4, may be modified as shown in FIG. 7. That is; in FIG. 7, reference numeral 71 denotes a coupler similar to coupler 46 and one end of coupler 71 is directly connected to GaAs-FET 44 without any DC blocking capacitor, while the other end thereof is bonded to one major surface of dielectric sheet 72 with an adhesive agent such as epoxy resin 73. The other major surface of dielectric sheet 72 is bonded to the inner surface of waveguide 41 with an adhesive agent such as epoxy resin 74. A sheet which is made of a dielectric material and has a low loss at high frequencies. For example, a mica sheet, a glass plate, a ceramic plate, a myler sheet, a polystyrene, or the like may be used as dielectric sheet 72. In this embodiment, capacitors 48 and 49 are replaced with dielectric sheet 72.

Referring again to FIG. 4, couplers 46 and 47 may be flat sheets in the form of a circle, an ellipsis, a rectangle, or having any suitable shape so that capacitors 48 and 49 can be eliminated.

Figure 8:
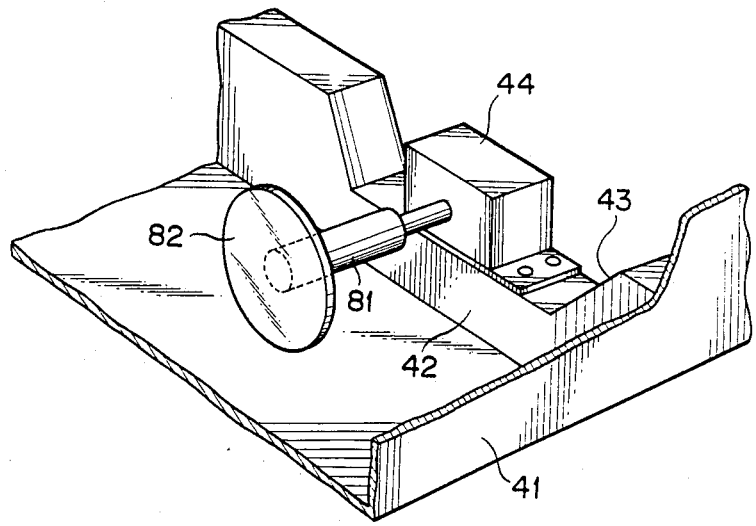
FIG. 8 is a perspective view, partly broken, of an embodiment of a further embodiment of the coupling means in the present invention.

For instance, as shown in FIG. 8, electromagnetic coupling means formed by flat plate 82 is connected to lead 81 which in turn is connected to GaAs-FET 44. The capacitance of flat plate 82 relative to waveguide 42 corresponds to form a capacitance by capacitor 48 or 49 shown in FIG. 4.

In the embodiment as shown in FIG. 4, the three-terminal amplifying device, i.e., GaAs-FET 44 is directly connected to shielding wall 42 connected to waveguide 41, so that all the heat generated in the three-terminal amplifying device 44 conducts through shielding wall 42 to waveguide 41, where the heat is cooled naturally or forcedly. In order to further enhance such heat dissipation, a heat radiator with fins may be formed integrally with a waveguide, as shown in FIG. 9.

Figure 9:
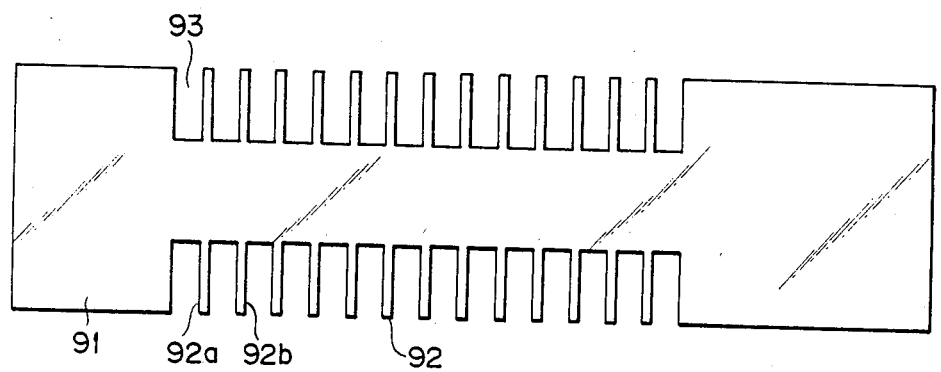
FIGS. 9 and 10 are further embodiments of a waveguide-mounted amplifier according to the present invention.

Further, in the embodiment shown in FIG. 9 in which a radiator with fins is formed integrally with a waveguide, reference numeral 91 designates a waveguide having the interior structure substantially similar to that of waveguide 41 shown in FIG. 4; and 92 and 93, designate heat radiators formed over the outer wall of waveguide 91. In the embodiment in FIG. 9, each of radiators 92 and 93 provides a plurality of fins so as to dissipate the heat generated in the interior of waveguide 91. For instance, fins 92a and 92b of radiator 92 are cooled by a coolant such as air, water or the like which flows around fins 92a and 92b so that waveguide 91 itself can be cooled. It should be noted that such coolant is forced to flow in the direction perpendicular to the drawing paper of FIG. 9.

Referring still to FIG. 9, while radiators 92 and 93 are disposed on both sides of waveguide 91, it is possible to eliminate either of radiators 92 and 93 according to actual design conditions.

Waveguide 91 and radiators 92 and 93 can be made of such metal structures as aluminum, brass, copper or Al-Mg alloy, each of which has a low electrical resistance and a low thermal resistance. Such heat transmission or conduction portions have extremely low thermal resistance and the waveguide itself is used as part of heat disspating means, and thus the heat capacity can be made very high.

In the waveguide amplifier in accordance with the present invention, a stabilized voltage is supplied to the incorporated three-terminal active device or GaAs-FET in order to keep the amplification stable. To this end, a voltage stabilizer or voltage regulator circuit is preferably provided independently of the waveguide, but such a voltage stabilizer or regulator needs an additional space for installation. However, the equipment operating at SHF must be made compact in size, but an actual size is large. According to the present invention, the terminals of a three-terminal active device are extended outwardly through the wall of the waveguide, so that a voltage regulator can be mounted directly on the outer surface of the waveguide. Thus, the waveguide-mounted amplifier can be further made in compact in size.

Figure 10:
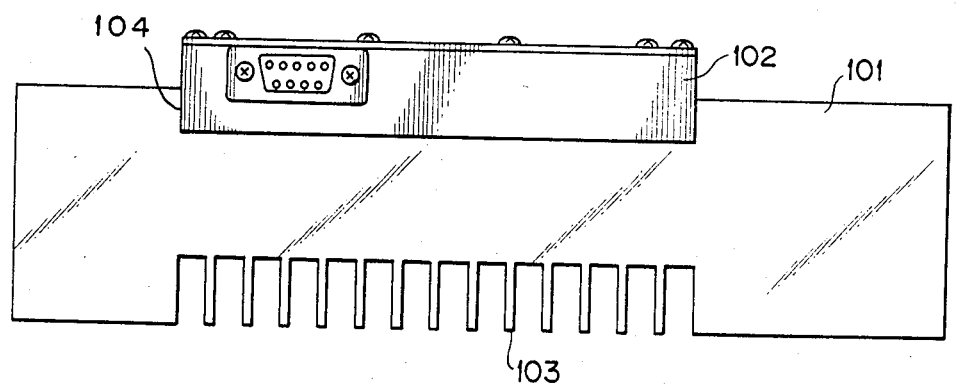

FIG. 10 shows an embodiment of the present invention in which a voltage regulator is mounted directly on one side of the outer surface of the waveguide and the other side of the waveguide has a heat radiator. In FIG. 10, reference numeral 101 designates a waveguide having the interior structure substantially similar to that of waveguide 41 shown in FIG. 4; and 102, a voltage regulator seated directly in recess 104 formed in waveguide 101. Voltage regulator 102 is electrically connected to GaAs-FET 44 through the wall of waveguide 101, like waveguide 41 shown in FIG. 4 or 5A. Voltage regulator 102 may be a conventional analog regulator or switching regulator in the form of a discrete circuit or an integrated circuit. Reference numeral 103 designates a heat radiator formed on the outer wall of waveguide 101 and having a plurality of fins. In FIG. 10, the heat generated in voltage regulator 102 is transferred to waveguide 101 and then dissipated from heat radiator 103. In this embodiment, voltage regulator 102 can be so designed and constructed that the power loss is approximately 2–3 W in order to obtain 10 W output, so that the temperature rise of the waveguide 101 due to the power loss in voltage regulator 102 can be kept at a minimum.

FIG. 11 shows an embodiment in which a plurality of, for example, two waveguide-mounted amplifiers shown in FIG. 4 are stacked so that the amplifiers are connected in parallel with each other. In FIG. 11, the two waveguide-mounted amplifiers are denoted by reference numerals 1001 and 1002. Reference numeral 1003 denotes an isolating plate located between amplifiers 1001 and 1002 so as to isolate one from another. Each amplifier configuration is the same as that shown in FIGS. 4 and 5 and portions in FIG. 11 corresponding to those shown in FIGS. 4 and 5 are denoted by the same reference numerals.

The input electromagnetic wave indicated by an arrow has an RF electric field E as illustrated in FIG. 12. Two amplifiers 1001 and 1002 are stacked in the direction of this RF electric field E. An input rectangular waveguide 1004 through which the input electromagnetic wave propagates is coupled to the input sides of parallel amplifiers 1001 and 1002 in a manner that the RF electric field direction of input waveguide 1004 is coincident with that of respective amplifiers 1001 and 1002.

The input electromagnetic wave is divided by isolating plate 1003 into two waves E1 and E2 which are inputted to respective amplifiers 1001 and 1002. The inputted waves E1 and E2 are amplified by amplifiers 1001 and 1002, respectively and then derived therefrom to be combined as an output wave indicated by an arrow. The output wave propagates through an output rectangular waveguide 1005 connected to amplifiers 1001 and 1002 by screws 1006. Output rectangular waveguide 1005 is coupled to the output sides of parallel amplifiers 1001 and 1002 in a manner that the RF electric field direction of output waveguide 1005 is coincident with that of respective amplifiers 1001 and 1002. The output electromagnetic waves from amplifiers 1001 and 1002 are combined and propagate through output rectangular waveguide 1005. In this manner, parallel amplification is performed by two amplifiers 1001 and 1002.

Figure 13:
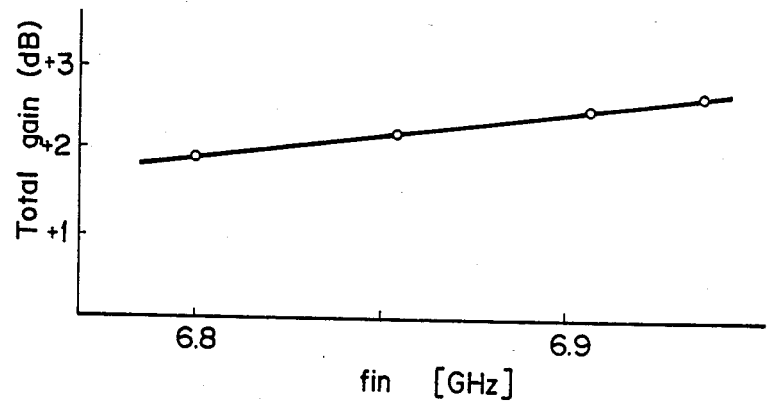
FIG. 13 illustrates a characteristic curve of total gain with respect to input frequency fin based on the data obtained in the experiments of the waveguide-mounted amplifier in accordance with the present invention.

FIG. 13 illustrates an example of a distribution of a total gain dB with respect to input frequency f in GHz in case that a combined amplifier as shown in FIG. 12 is used as a power amplification.

While in the above embodiments of the present invention, the waveguide-mounted amplifier is used in a power amplifying stage, a waveguide-mounted amplifier according to the present invention can be used as a low power stage such as a front-end amplifier. In such a case, it is clear that NF can be improved, since a loss is low because of amplification by direct coupling stages and a temperature increase is limited to the minimum.

FIG. 14 shows a further embodiment of a waveguide-mounted amplifier according to the present invention in which a plurality of, for example, two waveguide-mounted amplifiers shown in FIG. 4 are stacked so that the amplifiers are connected in series. In FIG. 14, the two waveguide-mounted amplifiers are denoted by reference numerals 1101 and 1102. Reference numeral 1103 denotes an isolating plate located between amplifiers 1101 and 1102 so as to isolate one from another. Each amplifier configuration is the same as that shown in FIGS. 4 and 5 and portions in FIG. 14 corresponding to those shown in FIGS. 4 and 5 are denoted by the same reference numerals. Reference numeral 1104 denotes a coupler for coupling first amplifier 1101 to second amplifier 1102.

An input electromagnetic wave indicated by an arrow and propagating through an input waveguide 1105 is supplied to first amplifier 1101. The output from first amplifier 1101 is fed to second amplifier via coupler 1104. The output from second amplifier 1102 is fed to an output waveguide 1106. Input and output waveguides 1105 and 1106 are connected to the input and output sides of first and second amplifiers 1101 and 1102, respectively. The input and output sides are located on the same side of amplifiers 1101 and 1102. The output and input sides of amplifiers 1101 and 1102 are opposite to coupler 1104 which is attached to an end plate 1107. Reference numerals 1108 and 1109 denote screws for connecting amplifiers 1101 and 1102 to input and output waveguides 1105 and 1106 and to end plat 1107, respectively.

In this structure, the output from first amplifier 1101 is fed to second amplifier 1102 through the shortest path. An electromagnetic wave propagates through first and second amplifier 1101 and 1102 in reverse directions, respectively, so that these amplifiers 1101 and 1102 are coupled in series via coupler 1104 to amplify the input electromagnetic wave in two steps.

While FIGS. 7 and 8 show two embodiments of coupling means, further variations and modifications of coupling means will be explained with reference to FIGS. 15–21.

Figure 15:
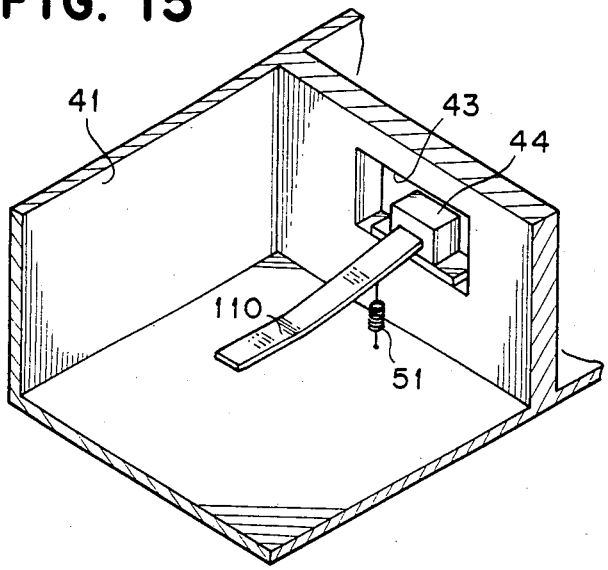
FIGS. 15–21 are perspective views, partly broken, of embodiments of the coupling means in the present invention.

In FIG. 15, rod 81 and disc 82 shown in FIG. 8 are replaced with bent reed 110 and the terminal of active device 44 is biased by a voltage applied thereto from a power supply through inductor 51.

Figure 16:
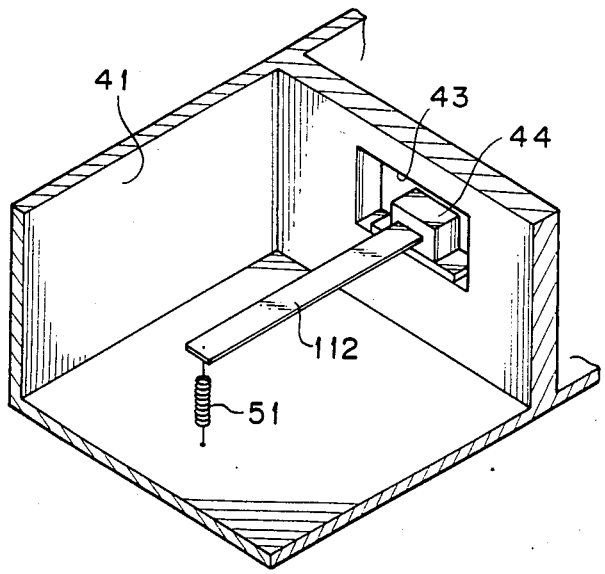

In FIG. 16, rod 81 and disc 82 shown in FIG. 8 are replaced with straight reed 112 and the terminal of active device 44 is biased by a voltage applied thereto from a power supply through inductor 51.

Figure 17:
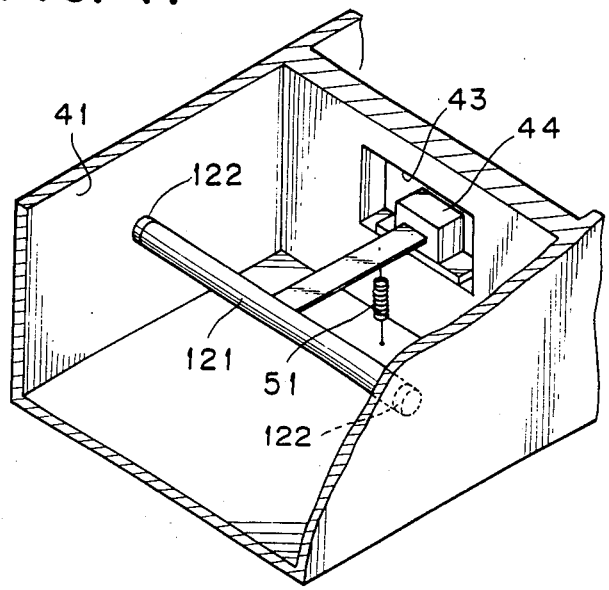

In FIG. 17, a rod antenna 121 as a coupling means is connected to active device 44 in such a way that rod antenna 121 is arranged in the same direction as the RF electric field and, for instance, the induced RF voltage across rod antenna 121 is fed to the terminal of active device 44. Both ends of rod antenna 121 are connected to the inner side walls of waveguide 41 through an insulator 122 so as to isolate rod antenna 121 from the inner side wall of waveguide 41, since a DC voltage is applied to the terminal of active device 44 through rod antenna 122.

Figure 18:
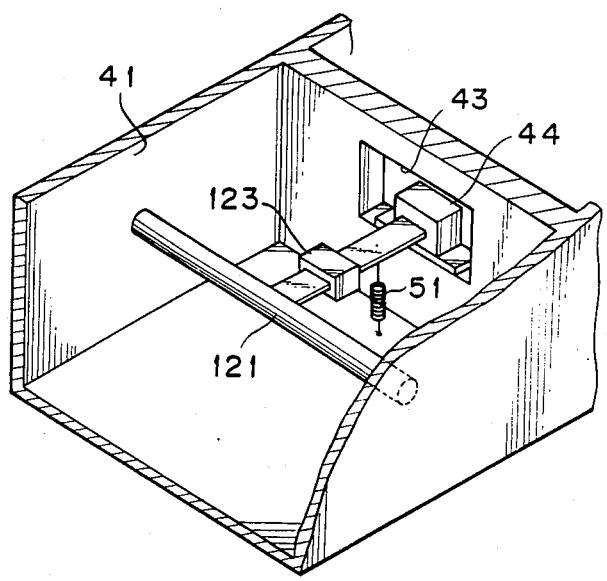

In FIG. 18, rod antenna 121 is connected to active device 44 via a capacitor 123. Both ends of rod antenna 121 are directly connected to the side walls of waveguide 41.

Figure 19:
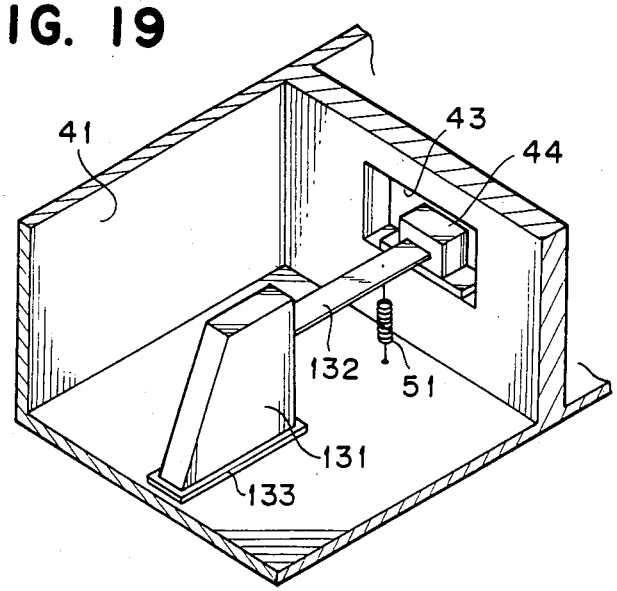

In FIG. 19, a tapered plate 131 which acts as a coupling means is connected to the terminal of active device 44 by a lead 132. Tapered plate 131 is attached to the inner bottom wall of the waveguide 41 via an insulator 133. Tapered plate 131 can also be used as an impedance matching means, i.e., as tapered terminator for RF power. Insulator 133 may be made of a Teflon (trade name) sheet or other low dielectric loss insulator sheet and provides the same function as insulator 122 in FIG. 17.

Figure 20:
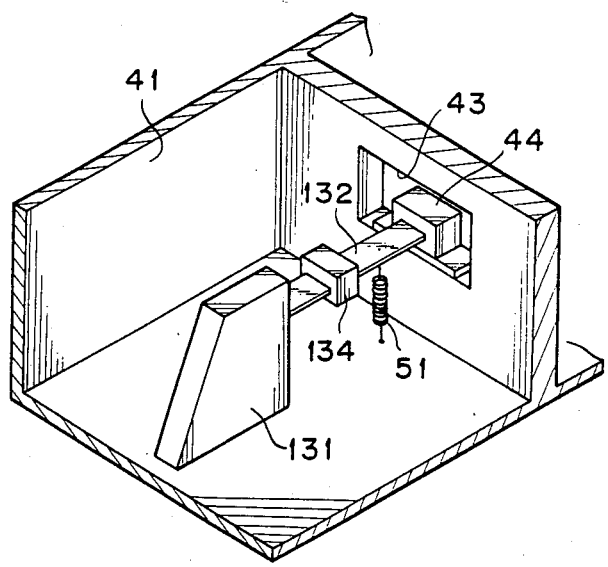

This insulator 133 can be replaced by a capacitor 134, as shown in FIG. 20.

Figure 21:
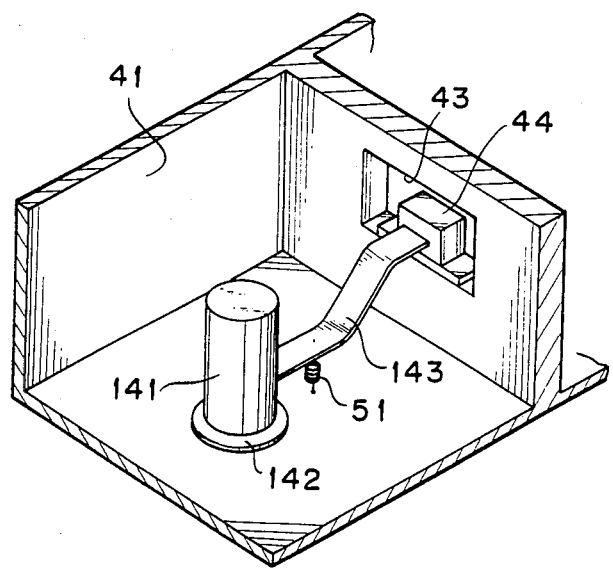

Furthermore, the coupling means can be of a rod type as shown in FIG. 21. In FIG. 21, a rod 141 is planted on the inner bottom wall of waveguide 41 via an insulator 142. Rod 141 is connected to active device 44 through a lead 143. Rod 141 induces an RF voltage. Insulator 142 isolates the DC power from the wall of waveguide 41, since a DC voltage for active device 44 is applied to lead 143 and rod 141.

Further, instead of the provision of insulator 142, a capacitor can be inserted to lead 143, like the embodiment shown in FIG. 20.

As described above, according to the present invention, the following effects, features and advantages can be obtained.

(1) According to the present invention, the metal partition wall is arranged inside the waveguide and has the aperture in which the amplifier element is mounted, so that the undesired coupling between the input and output can be reduced to a minimum and consequently stable amplification can be ensured.

(2) According to the present invention, a substrate or a strip line is not used, so that no mode conversion is required unlike a waveguide connected to a coaxial cable or strip line. As a result, losses due to such a mode conversion can be avoided and accordingly a very efficient amplifier can be provided.

(3) According to the present invention, a matching element such as ridge is not provided, so that the amplifier can be made compact in size and light in weight. In addition, the present invention can provide a wide band amplifier.

(4) Heat dissipation which is one of the very important problems in the power amplifier is solved by transferring heat through the metal partition wall to the exterior of the waveguide. Furthermore, heat can be dissipated by the fins formed around the waveguide. Therefore, from the standpoint of heat dissipation, the designs of the amplifier can be much facilitated.

(5) According to the present invention, the whole amplifier circuit is incorporated in the waveguide, so that a branch circuit, a synthesizer circuit or an isolators for waveguide which are easily available on the market can be utilized. As a result, in order to obtain a high output power, a plurality of amplifiers in accordance with the present invention can be easily combined without the aid of any special components or techniques.

(6) According to the present invention, the whole amplifier circuit is incorporated in the waveguide, so that a power supply can be easily integrally incorporated to the waveguide. As a result, a compact waveguide-mounted amplifier with power supply is obtained.

So far, the present invention has been described in connection with a power amplifier element, but it is to be understood that the present invention may equally be applied to the front-end amplifier of a receiver using a low-noise three-terminal amplifier device and to a power amplifier such as a power booster in an FPU system for relaying a TV program. In addition, the present invention may be advantageously applicable to an excellent solidstate amplifier such as SITs of hundreds-of-watt class at 3 GHz band which will replace a magnetron in an electronic oven.

What is claimed is:

1. A waveguide-mounted amplifier comprising:
   a waveguide having a heat sink provided on at least one outer surface of said waveguide;
   a partition wall located within said waveguide substantially perpendicular to a direction in which electromagnetic waves are propagated through said waveguide, said partition wall having an aperture; and
   an amplifying device located in said aperture of said partition wall.

2. A waveguide-mounted amplifier as claimed in claim 1, further comprising a DC power supply located on one outer surface of said waveguide other than said outer surface having said heat sink, and coupled to said amplifying device to feed electrical power to said amplifying device.

3. A waveguide-mounted amplifier comprising:
   a waveguide;
   a partition wall located within said waveguide substantially perpendicular to a direction in which electromagnetic waves are propagated through said waveguide, said partition wall separating said waveguide into an input section and an output section and having an aperture;
   a three-terminal active device located in said aperture and having a common terminal connected to said partition wall within said aperture and input and output terminals extended from both sides of said partition wall;
   an input coupling member for said three-terminal active element located in said input section of said waveguide and connected to said input terminal of said three-terminal active element;
   an output coupling member for said three-terminal active element located in said output section of said waveguide and connected to said output terminal of said three-terminal active element; and
   a set of high frequency blocking members for supplying DC power to said three-terminal active device.

4. A waveguide-mounted amplifier as claimed in claim 3, further comprising adjustable impedance matching members located in the vicinity of said input and output coupling members, respectively, so that impedances of said input and output coupling members including said three-terminal active device are matched to the waveguide characteristic impedance.

5. A waveguide-mounted amplifier as claimed in claim 4, wherein each of said matching members comprises a metal member securely attached to an inner wall surface of said waveguide and stubs which are adjustably extended into said waveguide through another inner wall which is in opposite to said inner wall surface of said waveguide to which said metal member is attached.

6. A waveguide-mounted amplifier as claimed in claim 3, wherein said input coupling member is formed by extending a first member into said input section of said waveguide from said input terminal of said three-terminal active device so that said extending first member performs at least one of inductive and electrostatic coupling to said input section of said waveguide, and said output coupling member is formed by extending a second member into said output section of said waveguide from said output terminal of said three-terminal active device so that said second extending member performs at least one of inductive and electrostatic coupling to said output section of said waveguide.

7. A waveguide-mounted amplifier as claimed in claim 3, wherein said input and output coupling members are substantially in the form of a T and the lower ends of the T shaped members are coupled to said input and output terminals, respectively, and the remaining ends of said T shaped members are coupled respectively to inner walls of said waveguide which are parallel to a magnetic field in said waveguide to thereby couple extending members, which extend into said input and output sections of said waveguides from said input and output terminals respectively, to said waveguide.

8. A waveguide-mounted amplifier as claimed in claim 7, wherein at least one of the couplings of said extending members to said input and output terminals and to said inner walls is an electrostatic coupling.

9. A waveguide-mounted amplifier as claimed in claim 3, wherein said input and output coupling members perform impedance matching.

10. A waveguide-mounted amplified as claimed in claim 9, wherein each of said input and output coupling members is a metal piece which has a tapered end portion located in the direction of the longitudinal axes of said input and output sections of said waveguide and major surfaces of said metal piece are coupled to an inner wall of said waveguide having a surface perpendicular to the plane of an electrical field in said waveguide.

11. A waveguide-mounted amplifier as claimed in claim 9, wherein metal conductor posts protrude from the surfaces of inner walls of said waveguide into an electrical field in said waveguide in a manner that each of said posts couples to said inner walls and middle portions of said posts are coupled to said input and output terminals, respectively.

12. A waveguide-mounted amplifier as claimed in claim 3, wherein said input and output coupling members are substantially in the form of the character L, one end of said input coupling member is coupled to a first surface of an inner wall in said input section of said waveguide perpendicular to an electric field in said waveguide and another end of said input coupling member is coupled to said input terminal of said three-terminal active device, and one end of said output member is coupled to a second surface of an inner wall in said output section of said waveguide perpendicular to an electric field in said waveguide and another end of said output coupling member is coupled to said output terminal of said three-terminal active device.

13. A waveguide-mounted amplifier as claimed in claim 12, wherein the distance between the vertical portion of each of said L-shaped input and output coupling members and said partition wall is substantially one quarter of a wavelength of said electromagnetic wave travelling through said waveguide.

14. A waveguide-mounted amplifier as claimed in claim 12, wherein at least one end of each of said L-shaped input and output coupling members performs electrostatic coupling.

15. A waveguide-mounted amplifier as claimed in claim 14, wherein one end of at least one of said input and output coupling members is coupled to said inner wall of said waveguide via a dielectric sheet.

16. A waveguide-mounted amplifier as claimed in claim 3, wherein said high frequency blocking members are mounted in said waveguide.

17. A waveguide-mounted amplifier configuration comprising:
a plurality of waveguides housing respective amplifiers therein, each of said amplifier-housing waveguides comprising:
a partition wall located within a said amplifier-housing waveguide substantially perpendicular to a direction in which electromagnetic waves are propagated through said amplifier-housing waveguide, said partition wall separating said amplifier-housing waveguide into two sections and having an aperture;
a three-terminal active device located in said aperture and having a common terminal connected to said partition wall within said aperature and input and output terminals extended from both sides of said partition wall;
an input coupling member for said three-terminal active element located in one section of said amplifier-housing waveguide and connected to said input terminal of said three-terminal active element;
an output coupling member for said three-terminal active element located in the other section of said amplifier-housing waveguide and connected to said output terminal of said three-terminal active element; and
a set of high frequency blocking members for supplying DC power to said three-terminal active device,
an input rectangular waveguide; and,
an output rectangular waveguide;
said amplifier-housing waveguides being stacked in a direction of an electric field passing therethrough, said amplifier-housing waveguides having respective waveguide input sections which are commonly connected to said input rectangular waveguide and respective waveguide output sections commonly connected to said output rectangular waveguide so that the input and output sections of each amplifier-housing waveguide respectively occupy a fraction of the total size of said input rectangular waveguide and said output rectangular waveguide,
the electric field directions of said input and output rectangular waveguides and said plurality of amplifier-housing waveguides being coincident with each other, whereby an input electric field is dividedly applied to said plurality of amplifier-housing waveguides and output electric fields from said plurality of amplifier-housing waveguides are combined so that parallel amplification is performed by said plurality of amplifier-housing waveguides.

18. A waveguide-mounted amplifier comprising:
a waveguide;
partition wall located within said waveguide substantially perpendicular to a direction in which electromagnetic waves are propagated through said waveguide, said partition wall separating said waveguide into two sections and having an aperature;
a three-terminal active device located in said aperture and having a common terminal connected to said partition wall within said aperture and input and output terminals extended from both sides of said partition wall;
an input coupling member for said three-terminal active element located in one section of said waveguide and connected to said input terminal of said three-terminal active element;
an output coupling member for said three-terminal active element located the other section of said waveguide and connected to said output terminal of said three-terminal active element;
a set of high frequency blocking members for supplying DC power to said three-terminal active device, and
a DC power source located on one outer surface of said waveguide and coupled to said amplifying device to feed electrical power to said amplifying device.

19. A waveguide structure comprising:
a plurality of rectangular waveguides each having a partition wall therein dividing said waveguide into two waveguide sections, said partition wall being arranged substantially perpendicular to a direction in which electromagnetic waves are propagated through said waveguide, a three-terminal active device located in said aperture and having a common terminal connected to said partition wall and input and output terminals extending from both sides of said partition wall, and means for respectively coupling said input and output terminals to said two waveguide sections, said rectangular waveguides being stacked in a direction of an electrical field propagating through said rectangular waveguides.

20. A waveguide-mounted amplifier as claimed in claim 19, wherein two adjacent rectangular waveguides are stacked in a manner that an input side of one waveguide corresponds to an output side of the other waveguide and that an output side of said one waveguide corresponds to an input side of said other waveguide, said input side of said one waveguide and said output side of said other waveguide being coupled to an input waveguide and an output waveguide, respectively, and said output side of said one waveguide and said input side of said other waveguide being coupled to each other via a member for coupling and radiating electromagnetic waves.

* * * * *